(12) United States Patent
Sakata

(10) Patent No.: US 11,752,670 B2
(45) Date of Patent: Sep. 12, 2023

(54) IMPRINT METHOD, IMPRINT APPARATUS, AND METHOD OF MANUFACTURING ARTICLE

(71) Applicant: CANON KABUSHIKI KAISHA, Tokyo (JP)

(72) Inventor: Yuji Sakata, Tochigi (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 70 days.

(21) Appl. No.: 17/326,694

(22) Filed: May 21, 2021

(65) Prior Publication Data

US 2021/0370559 A1 Dec. 2, 2021

(30) Foreign Application Priority Data

May 27, 2020 (JP) ................ 2020-092542

(51) Int. Cl.
 *B29C 43/58* (2006.01)
 *B29C 59/00* (2006.01)
 *G03F 9/00* (2006.01)
 *G03F 7/00* (2006.01)
 *B29C 59/02* (2006.01)

(52) U.S. Cl.
 CPC ............ *B29C 43/58* (2013.01); *B29C 59/002* (2013.01); *G03F 9/7042* (2013.01); *B29C 59/022* (2013.01); *B29C 2043/5875* (2013.01); *G03F 7/0002* (2013.01)

(58) Field of Classification Search
 None
 See application file for complete search history.

(56) References Cited

FOREIGN PATENT DOCUMENTS

| JP | 2016058735 A | 4/2016 | |
| KR | 20190134502 A | * 10/2019 | ......... B29C 35/0805 |

OTHER PUBLICATIONS

Atsushi (KR 10-2019-0134502 (Machine translation )) (Year: 2019).*

* cited by examiner

*Primary Examiner* — Robert J Grun
(74) *Attorney, Agent, or Firm* — ROSSI, KIMMS & McDOWELL LLP

(57) ABSTRACT

The present invention provides an imprint method of forming a pattern of an imprint material on a shot region of a substrate using a mold, the method comprising: supplying the imprint material onto the shot region so as to arrange droplets of the imprint material in arrangement patterns different from each other between a first partial region and a second partial region adjacent to each other in the shot region; performing alignment between the mold and the shot region after it is started to bring the mold and the imprint material into contact with each other; performing preliminary curing of irradiating the imprint material on the shot region with light to increase a viscoelasticity of the imprint material before the alignment is completed; and performing main curing of curing the imprint material on the shot region after the alignment is completed.

16 Claims, 10 Drawing Sheets

FIG. 8A

|   | | | | | | | |
|---|---|---|---|---|---|---|---|
| B { | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 1.0 | 1.0 | 1.0 | 1.0 | 1.0 | 1.0 | 1.0 | ← BD
| A { | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 1.0 | 1.0 | 1.0 | 1.0 | 1.0 | 1.0 | 1.0 | ← BD
| B { | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 1.0 | 1.0 | 1.0 | 1.0 | 1.0 | 1.0 | 1.0 |

FIG. 8B

|   | | | | | | | |
|---|---|---|---|---|---|---|---|
| B { | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 0.0 | 0.0 | 0.0 | 0.0 | 0.0 | 0.0 | 0.0 | ← BD
| A { | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 0.0 | 0.0 | 0.0 | 0.0 | 0.0 | 0.0 | 0.0 | ← BD
| B { | 1.0 | 1.0 | 1.0 | 1.0 | 1.0 | 1.0 | 1.0 |
|   | 1.0 | 1.0 | 1.0 | 1.0 | 1.0 | 1.0 | 1.0 |
|   | 1.0 | 1.0 | 1.0 | 1.0 | 1.0 | 1.0 | 1.0 |

FIG. 8C

|   | 1.2 | 1.2 | 1.2 | 1.2 | 1.2 | 1.2 | 1.2 |
|---|---|---|---|---|---|---|---|
| B | 1.2 | 1.2 | 1.2 | 1.2 | 1.2 | 1.2 | 1.2 |
|   | 1.2 | 1.2 | 1.2 | 1.2 | 1.2 | 1.2 | 1.2 |
|   | 0.2 | 0.2 | 0.2 | 0.2 | 0.2 | 0.2 | 0.2 | ← BD
|   | 1.2 | 1.2 | 1.2 | 1.2 | 1.2 | 1.2 | 1.2 |
| A | 1.2 | 1.2 | 1.2 | 1.2 | 1.2 | 1.2 | 1.2 |
|   | 1.2 | 1.2 | 1.2 | 1.2 | 1.2 | 1.2 | 1.2 |
|   | 0.2 | 0.2 | 0.2 | 0.2 | 0.2 | 0.2 | 0.2 | ← BD
|   | 1.2 | 1.2 | 1.2 | 1.2 | 1.2 | 1.2 | 1.2 |
| B | 1.2 | 1.2 | 1.2 | 1.2 | 1.2 | 1.2 | 1.2 |
|   | 1.2 | 1.2 | 1.2 | 1.2 | 1.2 | 1.2 | 1.2 |

FIG. 8D

|   | 1.25 | 1.25 | 1.25 | 1.25 | 1.25 | 1.25 | 1.25 |
|---|---|---|---|---|---|---|---|
| B | 1.25 | 1.25 | 1.25 | 1.25 | 1.25 | 1.25 | 1.25 |
|   | 1.25 | 1.25 | 1.25 | 1.25 | 1.25 | 1.25 | 1.25 |
|   | 0.0 | 0.0 | 0.0 | 0.0 | 0.0 | 0.0 | 0.0 | ← BD
|   | 1.25 | 1.25 | 1.25 | 1.25 | 1.25 | 1.25 | 1.25 |
| A | 1.25 | 1.25 | 1.25 | 1.25 | 1.25 | 1.25 | 1.25 |
|   | 1.25 | 1.25 | 1.25 | 1.25 | 1.25 | 1.25 | 1.25 |
|   | 0.0 | 0.0 | 0.0 | 0.0 | 0.0 | 0.0 | 0.0 | ← BD
|   | 1.25 | 1.25 | 1.25 | 1.25 | 1.25 | 1.25 | 1.25 |
| B | 1.25 | 1.25 | 1.25 | 1.25 | 1.25 | 1.25 | 1.25 |
|   | 1.25 | 1.25 | 1.25 | 1.25 | 1.25 | 1.25 | 1.25 |

…IMPRINT METHOD, IMPRINT APPARATUS, AND METHOD OF MANUFACTURING ARTICLE

BACKGROUND OF THE INVENTION

Field of the Invention

The present invention relates to an imprint method, an imprint apparatus, and a method of manufacturing an article.

Description of the Related Art

As a lithography apparatus for manufacturing a semiconductor device, a MEMS, or the like, there is known an imprint apparatus that molds an imprint material on a substrate using a mold. In the imprint apparatus, a liquid imprint material is supplied onto a substrate, and a mold is brought into contact with the imprint material on the substrate. Thereafter, the imprint material is cured in that state, and the mold is separated from the cured imprint material. With this operation, a pattern of the imprint material can be formed on the substrate.

In the imprint technique, before curing the imprint material, alignment between the mold and the substrate is performed in a state in which the mold is in contact with the imprint material on the substrate. In the alignment, the alignment accuracy between the mold and the substrate may be decreased due to disturbance such as a vibration from the floor on which the imprint apparatus is installed. Japanese Patent Laid-Open No. 2016-58735 proposes a method in which, in alignment between a mold and a substrate in a state in which the mold is in contact with an imprint material, the alignment accuracy is improved by performing preliminary curing by irradiating the imprint material with light to increase the viscosity of the imprint material.

In an imprint apparatus, if air bubbles remain between a mold and a substrate (shot region) when the mold and the imprint material on the substrate are in contact with each other, defects may be generated in the pattern of the imprint material formed on the substrate. Therefore, the shot region of the substrate is divided into a plurality of partial regions and, for each partial region, the droplet arrangement pattern of the imprint material can be optimized so as to decrease residual air bubbles. However, in a boundary portion between the plurality of partial regions, the arrangement pattern is insufficiently optimized. Accordingly, if the preliminary curing is performed in the boundary portion to increase the viscoelasticity of the imprint material, the filling property of the imprint material into a pattern with convex and concave portions of the mold is decreased and air bubbles are likely to remain.

SUMMARY OF THE INVENTION

The present invention provides a technique advantageous in improving the alignment accuracy between a mold and a substrate and reducing residual air bubbles between the mold and the substrate.

According to one aspect of the present invention, there is provided an imprint method of forming a pattern of an imprint material on a shot region of a substrate using a mold, the method comprising: supplying the imprint material onto the shot region so as to arrange droplets of the imprint material in arrangement patterns different from each other between a first partial region and a second partial region adjacent to each other in the shot region; performing alignment between the mold and the shot region after it is started to bring the mold and the imprint material on the shot region into contact with each other; performing preliminary curing of irradiating the imprint material on the shot region with light to increase a viscoelasticity of the imprint material before the alignment is completed; and performing main curing of curing the imprint material on the shot region after the alignment is completed, wherein in the preliminary curing, the imprint material is irradiated with light such that, in the shot region, an irradiation light quantity in a boundary portion between the first partial region and the second partial region is smaller than an irradiation light quantity in a portion different from the boundary portion.

Further features of the present invention will become apparent from the following description of exemplary embodiments with reference to the attached drawings.

BRIEF DESCRIPTION OF THE DRAWINGS

FIGS. 8A to 8D are views for explaining an example of adjusting a cumulative irradiation quantity by adjusting the illuminance.

DESCRIPTION OF THE EMBODIMENTS

Figure 1:
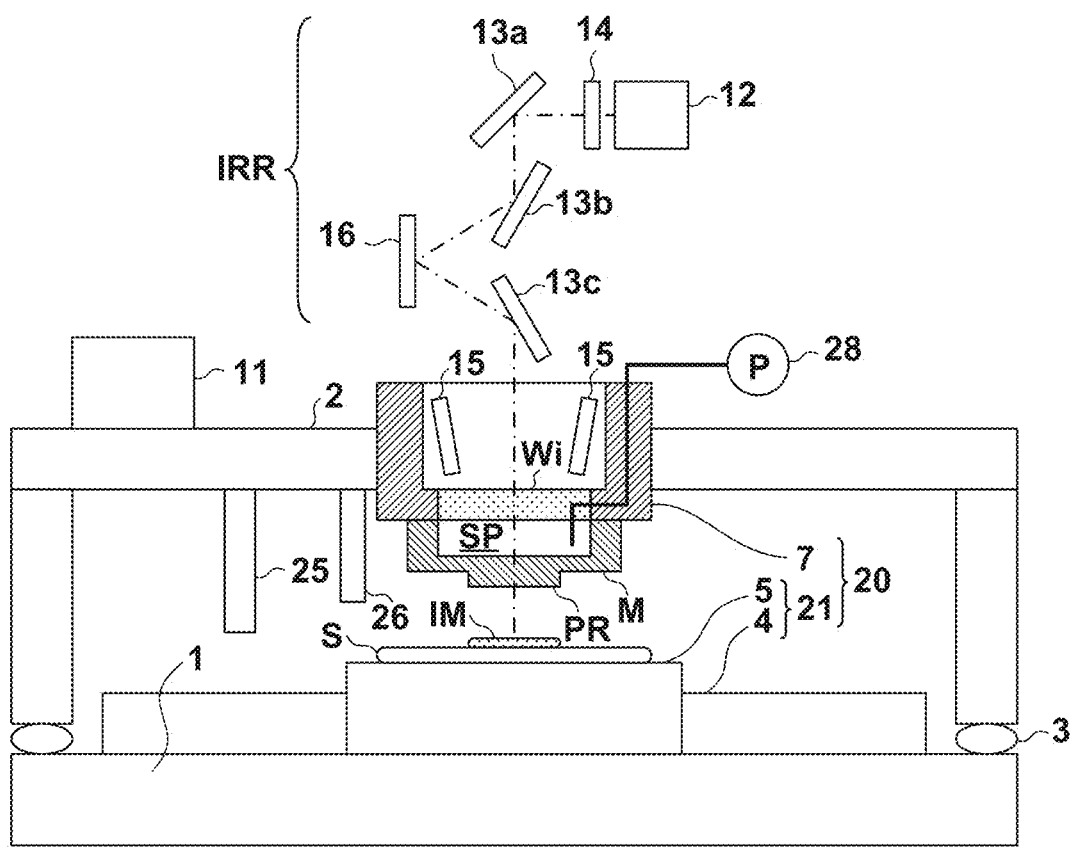
FIG. 1 is a schematic view showing the arrangement of an imprint apparatus.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate.

Furthermore, in the attached drawings, the same reference numerals are given to the same or similar configurations, and redundant description thereof is omitted.

First Embodiment

The first embodiment according to the present invention will be described. An imprint apparatus is an apparatus that forms a pattern of a cured product of an imprint material onto which a pattern with convex and concave portions on a mold is transferred by bringing an imprint material supplied onto a substrate into contact with a mold and applying energy for curing the imprint material. For example, the imprint apparatus supplies a liquid imprint material onto a substrate, and cures the imprint material in a state in which a mold on which a pattern with convex and concave portions has been formed is in contact with the imprint material on the substrate. Then, the imprint apparatus increases the spacing between the mold and the substrate, thereby separating the mold from the cured imprint material. Thus, the pattern of the mold can be transferred to the imprint material on the substrate. Such a series of processes is called an "imprint process", and is performed for each of one or a plurality of shot regions on the substrate.

The imprint process can include, for example, a supply step (arrangement step), a contact step, a curing step, and a separation step. In the supply step, an imprint material is arranged in the form of droplets (drops) on a shot region of a substrate. In the contact step that can be performed after the supply step, after the imprint material on a part of the shot region of the substrate is brought into contact with a pattern region of a mold, the contact area between the imprint material and the pattern region is enlarged to the whole area of the shot region. In the curing step that can be performed after the contact step, the imprint material is cured. In the separation step that can be performed after the curing step, the cured product of the imprint material and a mold M are separated from each other. Thus, a pattern formed of the cured product of the imprint material is formed on the shot region of the substrate.

As the imprint material, a curable composition (to be also referred to a resin in an uncured state) to be cured by receiving curing energy is used. As the curing energy, an electromagnetic wave can be used. The electromagnetic wave can be, for example, light selected from the wavelength range of 10 nm (inclusive) to 1 mm (inclusive), for example, infrared light, a visible light beam, ultraviolet light, or the like. The curable composition can be a composition cured by light irradiation. A photo-curable composition cured by light irradiation contains at least a polymerizable compound and a photopolymerization initiator, and may further contain a nonpolymerizable compound or a solvent as needed. The nonpolymerizable compound is at least one material selected from the group consisting of a sensitizer, a hydrogen donor, an internal mold release agent, a surfactant, an antioxidant, and a polymer component. The viscosity (the viscosity at 25° C.) of the imprint material can be, for example, 1 mPa·s (inclusive) to 100 mPa·s (inclusive). As the material of a substrate, for example, glass, ceramic, a metal, a semiconductor, a resin, or the like can be used. A member made of a material different from that of the substrate may be formed on the surface of the substrate, as needed. The substrate is, for example, a silicon wafer, a semiconductor compound wafer, or silica glass.

In the specification and the accompanying drawings, directions will be indicated on an XYZ coordinate system in which directions parallel to the surface of the substrate are defined as the X-Y plane. Directions parallel to the X-axis, the Y-axis, and the Z-axis of the XYZ coordinate system are the X direction, the Y direction, and the Z direction, respectively. A rotation about the X-axis, a rotation about the Y-axis, and a rotation about the Z-axis are θX, θY, and θZ, respectively. Control or driving concerning the X-axis, the Y-axis, and the Z-axis means control or driving concerning a direction parallel to the X-axis, a direction parallel to the Y-axis, and a direction parallel to the Z-axis, respectively. In addition, control or driving concerning the θX-axis, the θY-axis, and the θZ-axis means control or driving concerning a rotation about an axis parallel to the X-axis, a rotation about an axis parallel to the Y-axis, and a rotation about an axis parallel to the Z-axis, respectively. In addition, a position is information that can be specified based on coordinates on the X-, Y-, and Z-axes, and a posture is information that can be specified by values on the θX-, θY-, and θZ-axes. Positioning means controlling the position and/or posture. Alignment can include control of the position and/or posture of at least one of the substrate and the mold such that the alignment error (overlay error) between the shot region of the substrate and the pattern region of the mold decreases. In addition, alignment can include control to correct or change the shape of at least one of the shot region of the substrate and the pattern region of the mold.

[Arrangement of Imprint Apparatus]

FIG. 1 is a schematic view showing the arrangement of an imprint apparatus 100 according to this embodiment. The imprint apparatus 100 can include a base 1, a frame 2, a damper 3, a relative driving mechanism 20, an adjustment mechanism 28, a light irradiation unit IRR, alignment scopes 15, a dispenser 25, a purge gas supply unit 26, and a control unit 11. The relative driving mechanism 20 changes the relative position between a shot region of a substrate S and a pattern region PR of the mold M. Adjustment of the relative position by the relative driving mechanism 20 includes driving for bringing the mold M into contact with an imprint material IM on a shot region SR of the substrate S and separating the mold M from the cured imprint material IM (a pattern of a cured product). Adjustment of the relative position by the relative driving mechanism 20 also includes alignment between the substrate S (shot region SR thereof) and the mold M (pattern region PR thereof). The relative driving mechanism 20 can include a substrate positioning mechanism 21 that positions the substrate S (shot region SR thereof), and a mold positioning mechanism 7 that positions the mold M (pattern region PR thereof).

The substrate positioning mechanism 21 can include a substrate holding unit 5 that holds the substrate S, and a substrate driving mechanism 4 that drives the substrate S by driving the substrate holding unit 5. The substrate holding unit 5 and the substrate driving mechanism 4 can be supported by the base 1. The substrate driving mechanism 4 can be configured to drive the substrate S about a plurality of axes (for example, three axes of the X-, Y-, and θZ-axes, and preferably, six axes of the X-, Y-, Z-, θX-, θY-, and θZ-axes). The imprint apparatus 100 can include a measuring device (for example, an interferometer or an encoder) that measures the position of the substrate S or the substrate holding unit 5. Based on an output of the measuring device, feedback control of the position of the substrate holding unit 5 can be performed. The mold positioning mechanism 7 can include a mold holding unit (not shown) that holds the mold M, and a mold driving mechanism (not shown) that drives the mold M by driving the mold holding unit. The mold positioning mechanism 7 can be configured to drive the mold M about a plurality of axes (for example, three axes of the Z-, θX-, θY-axes, and preferably, six axes of the X-, Y-, Z-, θX-, θY-, and θZ-axes).

The imprint apparatus 100 can further include the adjustment mechanism 28 that adjusts, after the imprint material IM on the shot region SR of the substrate S and the pattern region PR partially come into contact with each other, the shape of the mold M such that the contact area between the imprint material IM and the pattern region PR is enlarged. The adjustment mechanism 28 can adjust the shape of the mold M (the shape in the plane parallel to the Z-axis) by adjusting the pressure in a space SP formed on the side of the back surface (the opposite side of the pattern region PR) of the mold M. The mold M can be made to protrude in a convex shape toward the substrate S or made into a flat shape by the adjustment mechanism 28.

The frame 2 can be provided on the base 1 via the damper 3. The damper 3 reduces transmission of vibration from the base 1 to the frame 2. The mold positioning mechanism 7 can be supported by the frame 2. The light irradiation unit IRR is configured to irradiate the imprint material IM (in other words, exposures the imprint material IM) on the shot region SR of the substrate S with light. The mold positioning mechanism 7 includes a window Wi that transmits light and defines the space SP. The light irradiation unit IRR can be configured to irradiate the imprint material IM with light through the window Wi.

The light irradiation unit IRR can include, for example, a light source 12, a shutter 14, mirrors 13a, 13b, and 13c, and a spatial light modulator 16. The spatial light modulator 16 can control, in accordance with an instruction from the control unit 11, the irradiation light quantity distribution of light applied to the imprint material IM on the shot region SR of the substrate S. The spatial light modulator 16 can be formed by, for example, a digital mirror device. The digital mirror device includes a plurality of mirrors, which can be controlled individually. By changing the angle of each of the plurality of mirrors, it is possible to control the irradiation light quantity distribution of light applied to the imprint material IM. Instead of the spatial light modulator 16, for example, a liquid crystal spatial light modulator may be used. Note that in this embodiment, an example will be described in which the illuminance distribution of light applied to the imprint material IM on the shot region SR of the substrate S is controlled as the irradiation light quantity distribution of light.

Light irradiation to the imprint material IM on the shot region SR of the substrate S, that is, exposure of the imprint material IM can be performed by preliminary curing (preliminary exposure) and main curing (main exposure) to be described later. The light irradiation unit IRR may include a plurality of light sources whose emission wavelengths and/or emission intensities are different from each other. For example, at least one light source corresponding to the preliminary curing can be used in the preliminary curing, and at least one light source corresponding to the main curing can be used in the main curing. In this case, a common spatial light modulator may be provided for the plurality of light sources, or a plurality of spatial light modulators respectively corresponding to the plurality of light sources may be provided.

The alignment scope 15 is used to detect an alignment error between the shot region SR of the substrate S and the pattern region PR of the mold M. The alignment scope 15 can be used to detect the relative position between a mark provided in the shot region SR and a mark provided in the pattern region PR. By detecting the relative position for each of a plurality of mark pairs, it is possible to detect the alignment error between the shot region SR of the substrate S and the pattern region PR of the mold M. Each mark pair is formed by the mark provided in the shot region SR and the mark provided in the pattern region PR. In the imprint apparatus 100, a die-by-die alignment method can be used as the alignment method between the shot region SR of the substrate S and the pattern region PR of the mold M.

The dispenser 25 (supply unit) arranges (supplies) the imprint material IM on the shot region of the substrate S. The dispenser 25 may be configured or controlled to arrange the imprint material IM on a plurality of shot regions SR of the substrate S. The imprint material IM can be arranged on the substrate S when the substrate positioning mechanism 21 scans or drives the substrate S while the dispenser 25 discharges the imprint material IM.

The purse gas supply unit 26 can supply a purge gas onto the substrate S to improve the filling property of the imprint material IM and suppress that oxygen hinders curing of the imprint material IM. As the purge gas, a gas that does not hinder curing of the imprint material IM, for example, a gas containing at least one of helium gas, nitrogen gas, and a condensable gas (for example, pentafluoropropane (PFP)) can be used. The purge gas supplied onto the substrate S can be transferred below the pattern region PR of the mold M by movement of the substrate S.

The control unit 11 can be configured to control the relative driving mechanism 20, the adjustment mechanism 28, the light irradiation unit IRR, the alignment scopes 15, the dispenser 25, and the purge gas supply unit 26. The control unit 11 can be formed from, for example, a PLD (an abbreviation for Programmable Logic Device) such as an FPGA (an abbreviation for Field Programmable Gate Array), an ASIC (an abbreviation for Application Specific Integrated Circuit), a general-purpose or dedicated computer installed with a program, or a combination of all or some of these components.

[Operation Procedure of Imprint Apparatus]

Figure 2:
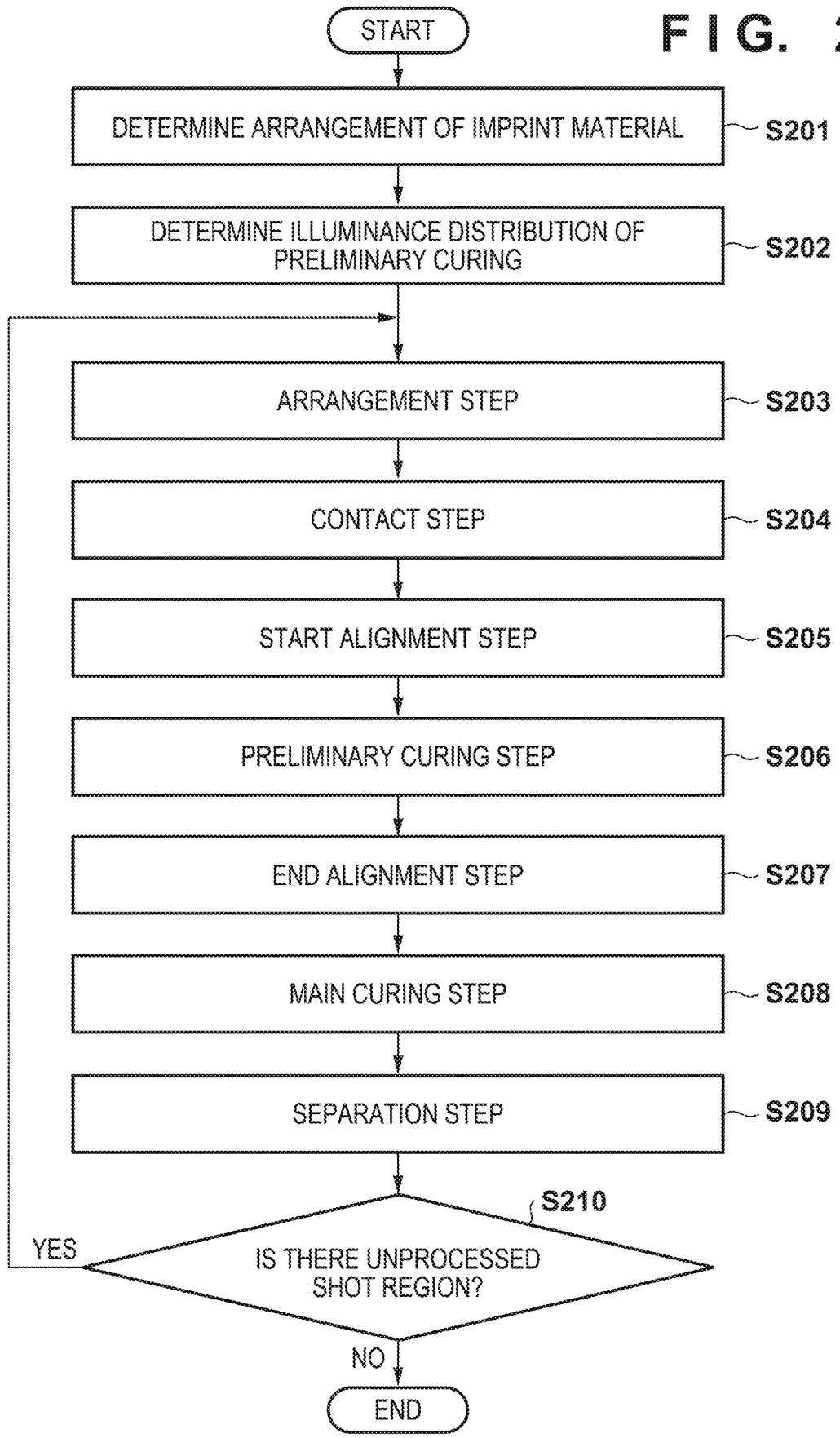
FIG. 2 is a flowchart showing an exemplary operation procedure of the imprint apparatus.

FIG. 2 exemplarily shows the operation procedure of the imprint apparatus 100 (the procedure of an imprint process). The operation procedure shown in FIG. 2 can be controlled by the control unit 11.

In step S201, the control unit 11 performs arrangement determination processing of determining the arrangement of the imprint material IM with respect to the shot region SR of the substrate S. This arrangement determination processing can include, for example, processing of generating a map (arrangement pattern or arrangement information) showing the positions of respective droplets (drops) of the imprint material IM to be arranged on the shot region SR of the substrate S.

In step S202, the control unit 11 performs illuminance distribution determination processing of determining the illuminance distribution of light to be applied in the preliminary curing (preliminary exposure) to be described later. The illuminance distribution determination processing includes processing of generating, from the arrangement information of the imprint material IM with respect to the shot region SR of the substrate S, information of a position where poor filling is likely to occur. The illuminance distribution determination processing further includes processing of generating a map (illuminance distribution) showing a region where light is to be applied in the preliminary curing. The illuminance distribution can be determined such that, in the shot region SR, the illuminance (or irradiation light quantity) of light applied to a first portion where poor filling is likely to occur is smaller than the illuminance (or irradiation light quantity) of light to be applied to a second portion different from the first portion. As one example, the illuminance distribution can be determined such that no light is applied to the second portion.

In step S203, a supply step (arrangement step) is performed. In the supply step, the control unit 11 controls the dispenser 25 and the substrate driving mechanism 4 such that the imprint material IM is arranged on the processing target shot region SR of the substrate S in accordance with the arrangement pattern of the imprint material IM determined in step S201. Here, in this example, in one step S203, the imprint material IM is arranged on one shot region SR where a pattern is to be formed immediately thereafter. However, in another example, step S203 may be changed such that the imprint material IM is continuously arranged on the plurality of shot regions SR.

In step S204, a contact step is performed. In the contact step, the imprint material IM on a part of the shot region SR of the substrate S is brought into contact with the pattern region PR of the mold M, and then the contact area between the imprint material IM and the pattern region PR is enlarged to the whole area of the shot region SR. In one example, in the contact step, the control unit 11 controls the adjustment mechanism 28 such that the pattern region PR formed as a mesa portion is made into a convex shape toward the substrate S. Then, in this state, the control unit 11 controls the mold driving mechanism and/or the substrate driving mechanism 4 so as to bring the imprint material IM on a part (for example, central portion) of the shot region of the substrate S into contact with a part (for example, central portion) of the pattern region PR of the mold. Subsequently, the control unit 11 controls the mold driving mechanism and/or the substrate driving mechanism 4 and the adjustment mechanism 28 so as to enlarge the contact area between the imprint material IM and the pattern region PR to the whole area of the shot region SR. Here, the operation for enlarging the contact area can include an operation of decreasing the distance between the substrate S and the pattern region PR of the mold M by the mold driving mechanism and/or the substrate driving mechanism 4 while returning the pattern region PR to be flat by the adjustment mechanism 28. In the state in which the imprint material IM and the pattern region PR are in contact with each other, the imprint material is filled into a concave portion of the pattern region PR.

In step S205, an alignment step is started. The alignment step is started after the contact step (S204) is started (that is, after it is started to bring the mold M into contact with the imprint material IM on the shot region SR of the substrate S). For example, the alignment step may be started after the contact step (S204) is completed, or may be started during the contact step so as to be performed in parallel with at least a part of the contact step (S204). In the alignment step, the relative position between the mark provided in the mold M and the mark provided in the substrate S is detected by the alignment scope 15, and alignment between the mold M and the substrate S is performed based on the detection result. As the alignment step, the control unit 11 starts an operation of detecting the alignment error between the shot region SR where a pattern is to be formed and the pattern region PR using the alignment scope 15 and controlling the relative driving mechanism 20 so as to decrease the alignment error.

In step S206, a preliminary curing (preliminary exposure) step is performed. The control unit 11 controls the light irradiation unit IRR so as to perform preliminary curing with respect to the imprint material IM on the shot region SR of the substrate S. The preliminary curing step can be performed before the alignment step is completed so that the preliminary curing step is performed in parallel with at least a part of the alignment step. The preliminary curing is processing of curing the imprint material IM to a first target hardness by irradiating the imprint material IM on the shot region SR of the substrate S with light to increase the viscoelasticity of the imprint material IM during the alignment between the substrate S and the mold M. The value of the first target hardness is lower than that of a second target hardness to which the imprint material IM is cured in a main curing (main exposure) step to be described later. The first target hardness can be set to a hardness with which the viscoelasticity of the imprint material IM is higher than that of the imprint material IM supplied in the supply step but the imprint material IM still has fluidity (that is, the imprint material IM is flowable).

The preliminary curing step may be performed in a state in which the imprint material IM on the shot region SR of the substrate S and the whole area of the pattern region PR are in contact with each other and the pattern region PR is made flat (that is, after the contact step is completed). Alternatively, the preliminary curing step may be performed after it is started to bring the imprint material IM and the pattern region PR into contact with each other and before the alignment step of the substrate S and the mold M is completed. Since the preliminary curing increases the viscoelasticity of the imprint material IM and increases the degree of coupling between the substrate S and the mold M via the imprint material IM, the relative vibration between the substrate S and the mold M in the state in which the mold M and the imprint material IM are in contact with each other is decreased. Accordingly, the alignment accuracy between the shot region SR of the substrate S and the pattern region PR of the mold M can be improved. Here, the preliminary curing is performed under a condition (for example, illuminance distribution) in which the imprint material IM is sufficiently filled into the concave portion of the pattern region PR of the mold M or a space between the substrate S and the pattern region PR over the whole area of the shot region SR. Such a preliminary curing condition will be described later. The preliminary curing may be dividedly performed in a plurality of times.

In step S207, the alignment step is completed. The control unit 11 determines whether the alignment between the shot region SR of the substrate S and the pattern region PR of the mold M is completed. If it is determined that the alignment is completed, the control unit 11 terminates the alignment step and advances to step S208. Here, the control unit 11 can determine that the alignment is completed, for example, if the alignment error detected using the alignment scope 15 falls within an allowable value range. Alternatively, the control unit 11 may determine that the alignment is completed if an elapsed time since the alignment between the shot region SR and the pattern region PR is started has reached a predetermined time. In this case, the predetermined time can be set such that the sufficiently high alignment accuracy can be obtained.

In step S208, a main curing (main exposure) step is performed. The main curing step is performed after the imprint material IM is sufficiently filled into the concave portion of the pattern region PR. The control unit 11 controls the light irradiation unit IRR so as to perform main curing of the imprint material by irradiating the imprint material IM between the substrate S and the pattern region PR with the curing energy. The main curing is processing of curing the imprint material to the second target hardness by irradiating the imprint material IM between the substrate S and the mold M with light after the alignment between the substrate S and the mold M is completed. The value of the second target hardness is higher than that of the first target hardness to which the imprint material IM is cured in the preliminary curing (preliminary exposure) step. The second target hardness can be set to a hardness with which the imprint material IM has no fluidity and the shape of the pattern with convex and concave portions transferred to the imprint material can be maintained even after a separation step to be described later. By the main curing step, the imprint material IM is cured and a pattern formed of a cured product of the imprint material IM is formed.

In step S209, the separation step is performed. In the separation step, the control unit 11 controls the mold driving mechanism and/or the substrate driving mechanism 4 so as to separate the cured product of the imprint material IM from the pattern region PR of the mold M. Then, in step S210, the control unit 11 determines whether pattern formation has been completed for all the shot regions SR on each of which the pattern is to be formed. If the pattern formation has not been completed yet, the process returns to step S203 to form the pattern on the unprocessed shot region.

[Generation of Arrangement Pattern]

In the step of enlarging the contact area between the imprint material IM on the substrate S and the mold M, if a gas is trapped in a space surrounded by the substrate S, the mold M, and the imprint material IM, the imprint material IM is disabled to be filled into the concave portion of the mold M. If the imprint material IM is cured in a state in which the imprint material IM is insufficiently filled into the concave portion of the mold M, a failure (for example, a defect) can be generated in the pattern formed of the cured product of the imprint material IM. Therefore, it is required to wait for the start of curing the imprint material IM until the gas trapped in the space disappears by dissolution in the imprint material IM or condensation so that the imprint material IM is filled into the concave portion of the mold M. Such a process can decrease throughput. The gas can be trapped when a discharge path of the gas is blocked by the imprint material IM. Therefore, how the droplets of the imprint material are arranged on the substrate S is important.

Figure 3:
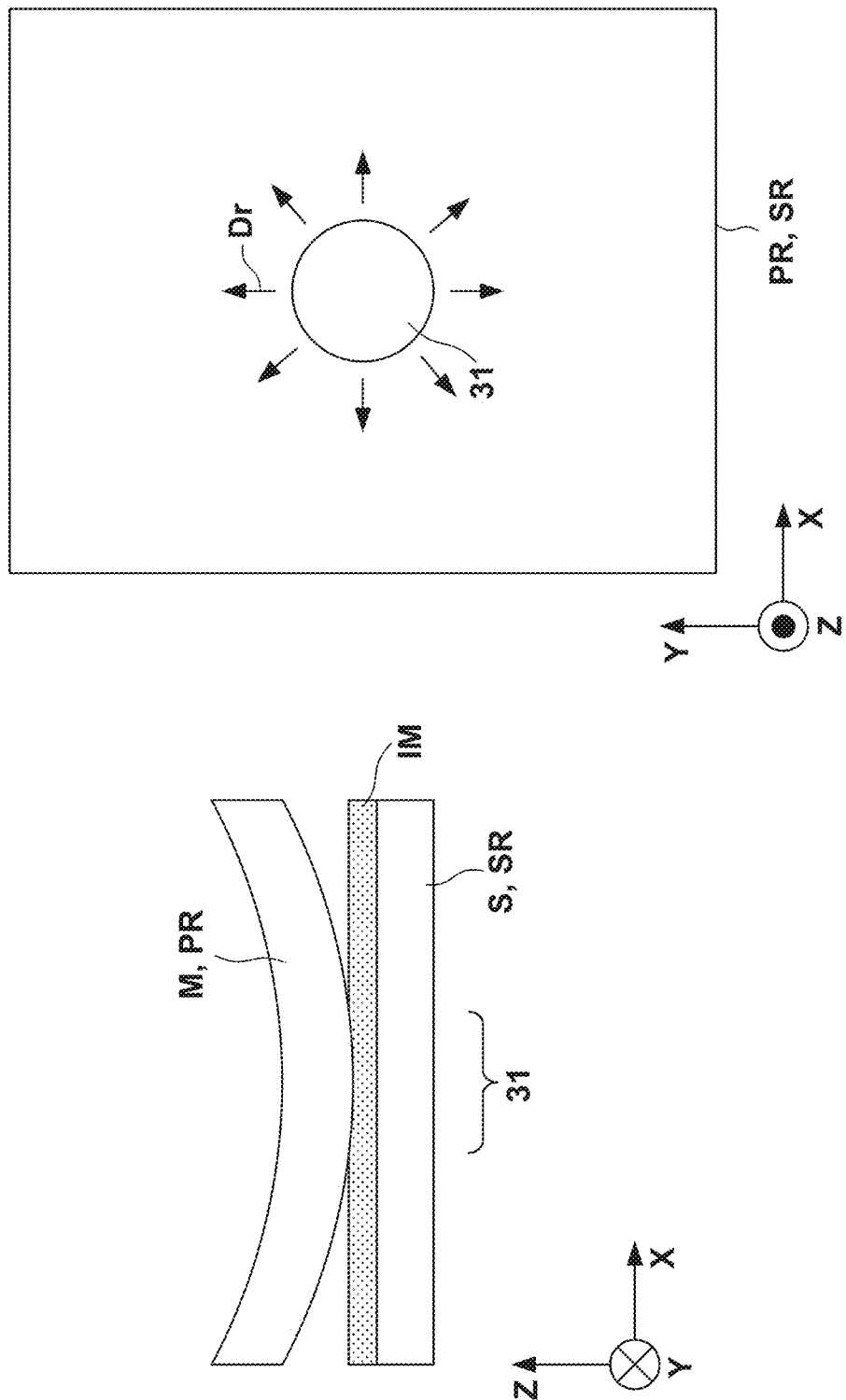
FIGS. 3A and 3B are views for explaining enlargement of a contact area between an imprint material and a mold.

With reference to FIGS. 3A and 3B, the enlargement of the contact area between the imprint material IM and the mold M (pattern region PR thereof) in the contact step will be described. Note that in FIGS. 3A and 3B, for the sake of convenience, the imprint material IM is shown not in a droplet state but in a film state. Each of FIGS. 3A and 3B schematically shows a state in which the pattern region PR of the mold M is deformed into a convex shape and a part (here, central portion) of the pattern region PR is in contact with the imprint material IM on the shot region SR. Reference numeral 31 denotes the contact area between the imprint material IM and the pattern region PR. As the contact step progresses, the contact area 31 is enlarged. The contact area 31 is enlarged in a radiation directions Dr from the part (central portion) where the contact between the imprint material IM and the pattern region PR is started. The radiation directions Dr can match the directions in which the contact area 31 is enlarged.

Figure 4:
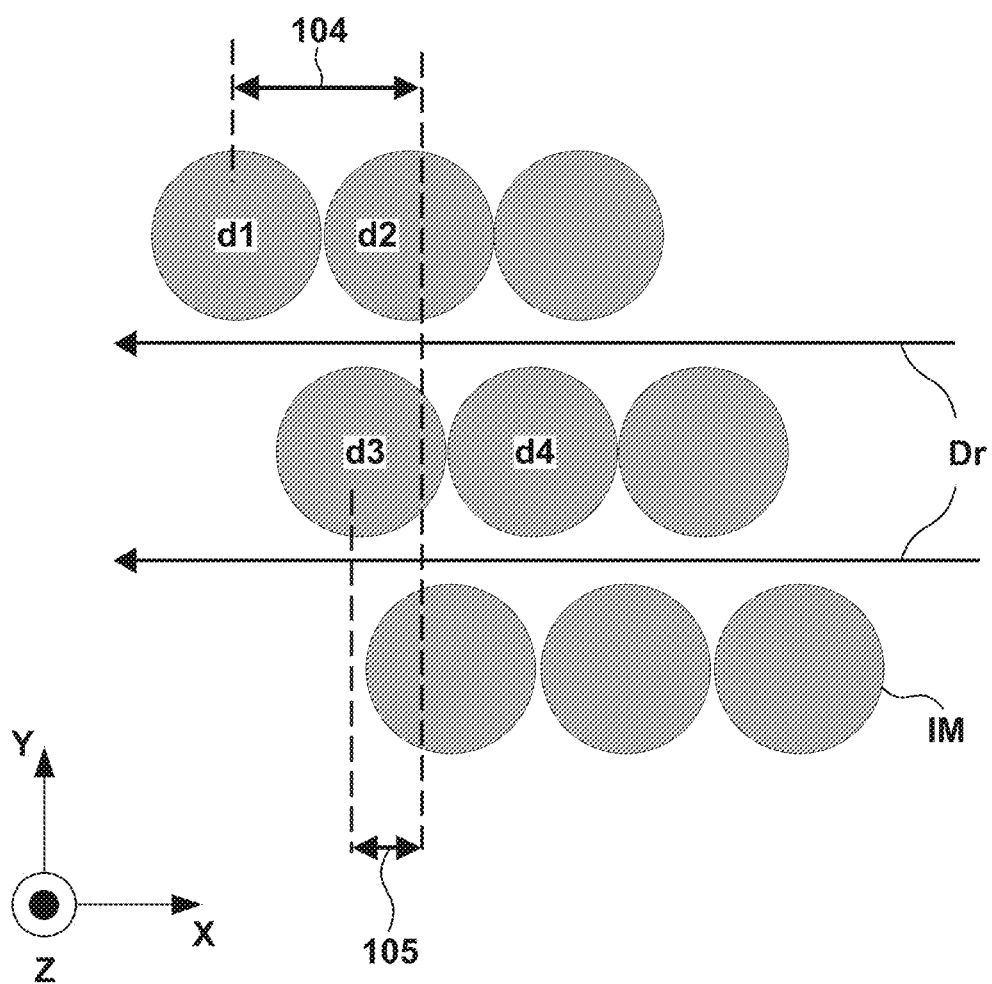
FIG. 4 is a view for explaining an evaluation index for the droplet arrangement of the imprint material.

Next, a method of generating arrangement information indicating the positions of droplets of the imprint material IM to be arranged on the shot region of the substrate S will be described. The arrangement information can be generated by evaluating the droplet arrangement of the imprint material IM and optimizing the droplet arrangement of the imprint material IM based on the evaluation result. FIG. 4 is a view for explaining an example of the evaluation index for the droplet arrangement of the imprint material IM. FIG. 4 shows a local region in the shot region SR, and each gray circle indicates the droplet of the imprint material IM. Some droplets are shown as droplets d1, d2, d3, and d4 to distinguish them from each other. In FIG. 4, the radiation direction Dr is the −X direction.

The lower the directional droplets density of the imprint material IM on a line, which is parallel to the direction (Y direction) perpendicular to the radiation direction Dr (−X direction) and on which a plurality of droplets of the imprint material IM exist, the easier the gas is discharged during the enlargement of the contact area. Therefore, the directional droplets density can serve as the evaluation index for the droplet arrangement of the imprint material IM. Further, the smaller a distance 104 between the droplet d1 and the droplet d2 in the direction (−X direction) parallel to the radiation direction Dr, the easier the droplet d1 and the droplet d2 couple with each other during the enlargement of the contact area, so that the gas discharge path is easily limited to the radiation direction Dr. Accordingly, the smaller the distance 104 between the droplet d1 and the droplet d2 in the direction parallel to the radiation direction Dr, the shorter the filling time can be. Thus, the distance 104 can also serve as the evaluation index for the droplet arrangement of the imprint material IM. Further, a positional shift 105 between the droplet d2 and the droplet d3 in the radiation direction Dr influences the size of a void (a pore (air bubble) trapping the gas) formed when the droplet d2 and the droplet d3 couple with each other during the enlargement of the contact area. When the positional shift 105 is about ½ of the array pitch of the droplets in the radiation direction Dr, the void can be smallest and the filling time can be shortened. Accordingly, the positional shift 105 can also serve as the evaluation index for the droplet arrangement of the imprint material IM. Based on the three evaluation indices described above, the droplet arrangement of the imprint material IM can be optimized. Note that optimization of the droplet arrangement of the imprint material IM is not limited to be performed based on the three evaluation indices described above, but another evaluation index may be used in addition to or instead of the above-described evaluation indices.

The optimization of the droplet arrangement of the imprint material IM as described above can be performed for each of a plurality of partial regions obtained by dividing the shot region SR of the substrate S. Each partial region may be set so as to have, for example, an area equal to or larger than $\frac{1}{100}$ (in another example, equal to or larger than $\frac{1}{50}$, equal to or larger than $\frac{1}{10}$, or equal to or larger than $\frac{1}{8}$) of the area of the shot region SR. Further, each partial region may be set such that, for example, 100 or more (in another example, 500 or more, or 50 or more) droplets of the imprint material IM are arranged therein. The droplet arrangement of the imprint material IM in each partial region can be optimized (determined) such that the resistance value which hinders the discharge of the gas in the radiation direction Dr is smaller than the resistance value which hinders the discharge of the gas in the direction orthogonal to the radiation direction Dr. Here, the number, arrangement, sizes, and the like of the plurality of partial regions in the shot region SR can be determined appropriately by an experiment, a simulation, or the like.

Figure 5A:
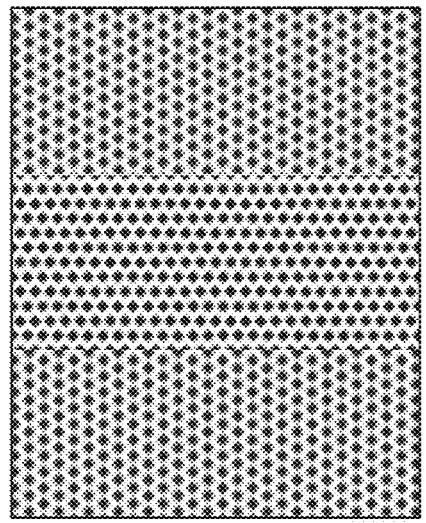
FIGS. 5A and 5B are views showing the arrangement pattern of the imprint material in a shot region.
Figure 5B:
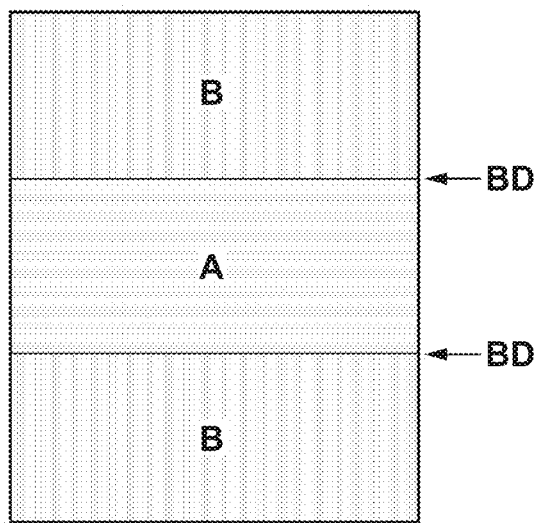

FIGS. 5A and 5B exemplarily show the arrangement pattern of the droplets of the imprint material IM in the shot region SR. In the example shown in FIGS. 5A and 5B, the shot region SR is divided into three partial regions arranged in the Y direction. The three partial regions are formed by one partial region A and two partial regions B. The two partial regions B are regions that are adjacent to the partial region A in the Y direction and sandwich the partial region A. Here, when each of the one partial region A and the two partial regions B is considered as the local region described above, in each partial region, one direction of the radiation directions Dr is set as a representative direction, and the droplet arrangement of the imprint material IM is individually optimized based on the representative direction. That is, between the partial region A and the partial region B adjacent to each other, the arrangement patterns of the droplets of the imprint material IM are different from each other. As one example, when the droplets of the imprint material IM are arranged in a grid (for example, a rectangular grid or a staggered grid) in each partial region, as the arrangement pattern, at least one of the orientation, shape, and dimension of the grid in which the respective droplets are arranged can differ between the partial region A and the partial region B.

For example, in the partial region A, the X direction (first direction), which is one main (dominant) direction among the radiation directions Dr in the partial region A, is set as the representative direction. Then, the droplet arrangement of the imprint material IM is optimized such that the droplet interval in the representative direction (X direction) is smaller than the droplet interval in the direction (Y direction) perpendicular to the representative direction. Thus, the arrangement pattern (first arrangement pattern) of the imprint material IM in the partial region A is determined. In the partial region A, arrangement of the droplets of the imprint material IM in the first arrangement pattern is repeated for each unit area in the supply step. The unit area is an area smaller than each partial region, and can be defined as the minimum area where the droplets of the imprint material can be arranged in the same arrangement pattern.

On the other hand, in the partial region B, the Y direction (second direction), which is one main (dominant) direction among the radiation directions Dr in the partial region B, is set as the representative direction. Then, the droplet arrangement of the imprint material IM is optimized such that the droplet interval in the representative direction (Y direction) is smaller than the droplet interval in the direction (X direction) perpendicular to the representative direction. Thus, the arrangement pattern (second arrangement pattern) of the imprint material IM in the partial region B is determined. In the partial region B, arrangement of the droplets of the imprint material IM in the second arrangement pattern is repeated for each unit area in the supply step.

In this manner, in the partial region A and the partial region B, the droplet arrangement of the imprint material IM is individually optimized. However, the optimization is insufficient (incomplete) in a boundary portion BD between the partial region A and the partial region B. Therefore, if the preliminary curing is performed in the boundary portion BD to increase the viscoelasticity of the imprint material IM, the filling property of the imprint material IM with respect to the pattern (concave portion) of the mold M can be decreased. That is, filling of the imprint material IM into the pattern (concave portion) of the mold M is not completed in a predetermined filling time, and the process advances to the curing step while voids (air bubbles) remain. In this manner, voids are more likely to be generated in the boundary portion BD between the partial region A and the partial region B than inside each partial region (for example, central portion thereof). As a result, a defect due to poor filling can be generated in the pattern formed of the cured product of the imprint material IM.

Therefore, in the preliminary curing according to this embodiment, light is applied to the imprint material IM on the shot region SR such that the irradiation light quantity in the boundary portion BD between the first partial region and the second partial region of the shot region SR of the substrate S is smaller than the irradiation light quantity in a portion different from the boundary portion BD. As one example, in the preliminary curing, light is applied to the imprint material IM such that the irradiation light quantity in the boundary region BD of the shot region SR is equal to or smaller than a half (in another example, equal to or smaller than ¼) of the irradiation light quantity in the portion different from the boundary portion BD. In this embodiment, the first partial region can be the one partial region A, and the second partial region can be each of the two partial regions B. The boundary portion BD can include a boundary between the first partial region (partial region A) and the second partial region (partial region B).

Figure 6:
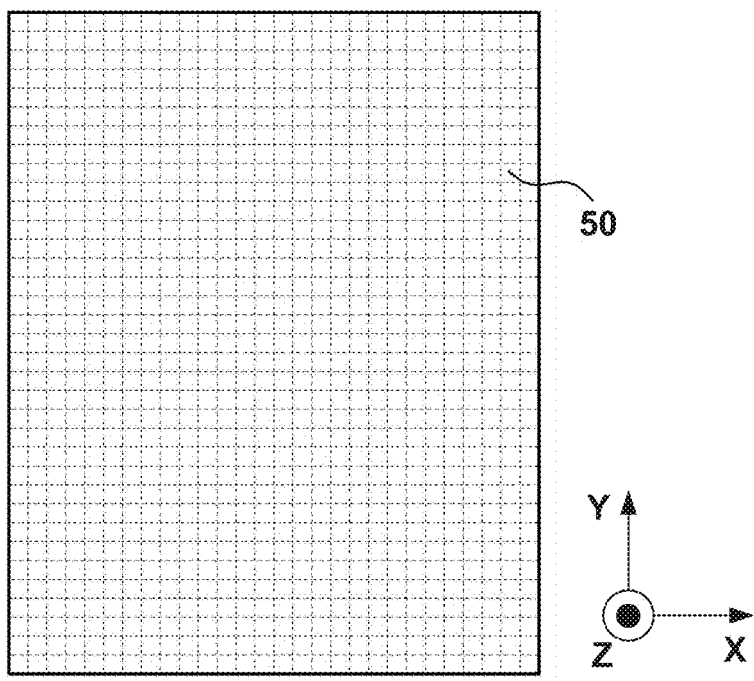
FIG. 6 is a view showing a plurality of unit irradiation regions in the shot region.

Next, processing of generating the illuminance distribution in the shot region SR in the preliminary curing will be described. FIG. 6 shows a plurality of unit irradiation regions 50 in the shot region SR of the substrate S where the irradiation light quantity (illuminance) can be individually adjusted by the light irradiation unit IRR (spatial light modulator 16). In the example shown in FIG. 6, the shot region SR is divided into 28×35 unit irradiation regions 50, and the irradiation light quantity in each unit irradiation region 50 can be individually adjusted by the light irradiation unit IRR (spatial light modulator 16). In this embodiment, the illuminance distribution is generated by controlling switching between irradiation (ON) and non-irradiation (OFF) of light for each unit irradiation region 50. In this case, the illuminance distribution is generated by, among the plurality of unit irradiation regions 50, setting non-irradiation (OFF) for the unit irradiation regions 50 each including a portion (boundary portion BD) where poor filling is likely to occur, and setting irradiation (ON) for the other unit irradiation regions 50.

Figure 5C:
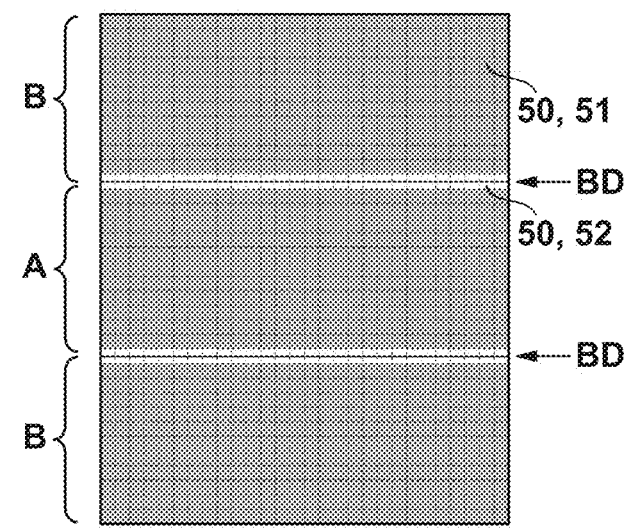
FIG. 5C is a view showing the illuminance distribution of light to be applied in preliminary curing.

FIG. 5C shows the illuminance distribution of light to be applied in the preliminary curing when the arrangement pattern of the droplets of the imprint material IM shown in FIGS. 5A and 5B is used. More specifically, FIG. 5C is a view in which the position information of the boundary portion BD shown in FIG. 5B is superimposed on the plurality of unit irradiation regions 50 (division of the irradiation region) shown in FIG. 6. The illuminance distribution of light shown in FIG. 5C is set (generated) such that, among the plurality of unit irradiation regions 50, irradiation (ON) is set for unit irradiation regions 51 each including no boundary portion BD, and non-irradiation (OFF) is set for unit irradiation regions 52 each including the boundary region BD.

[Another Example]

Figure 7A:
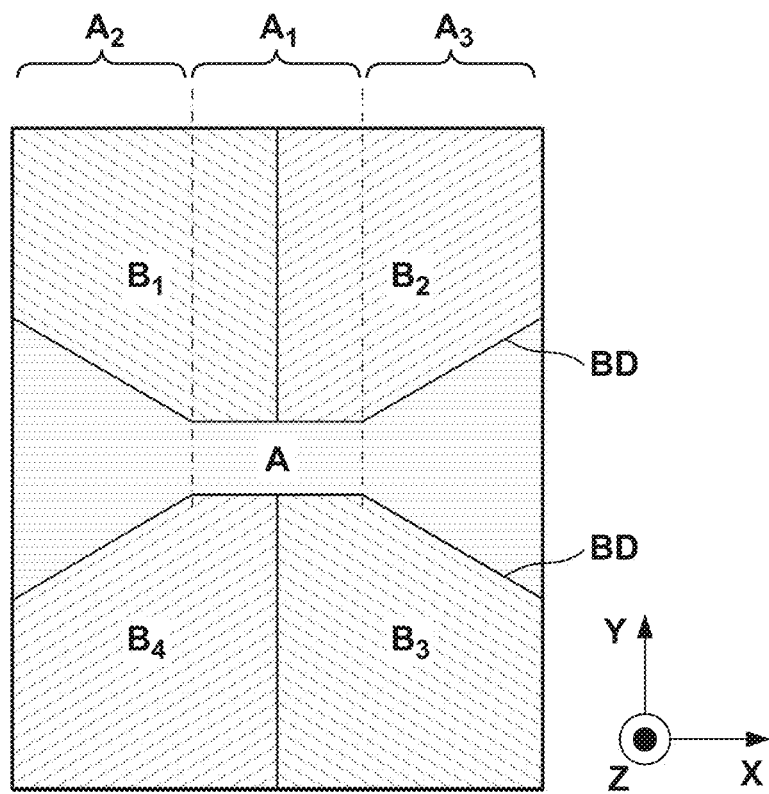
FIG. 7A is a view showing the arrangement pattern of the imprint material in the shot region.
Figure 7B:
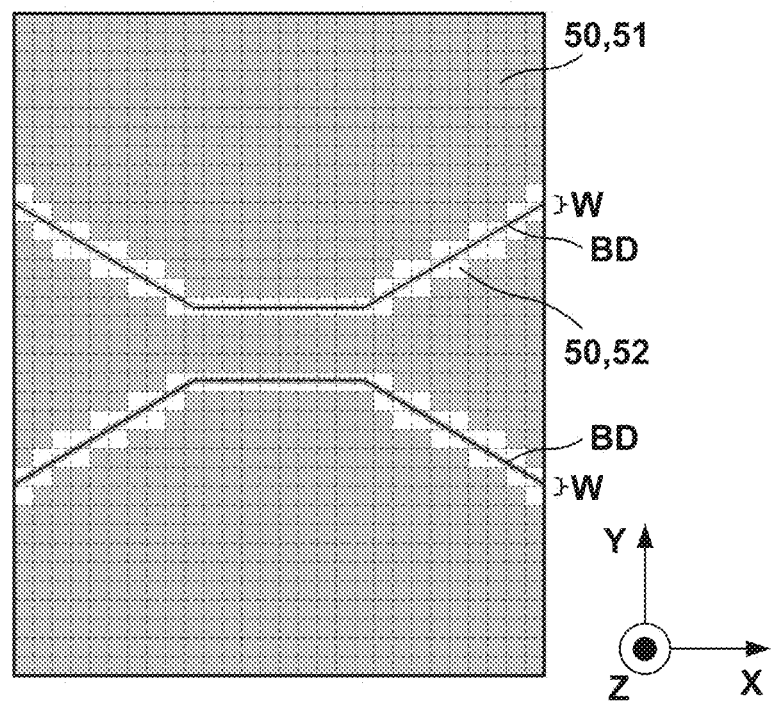
FIG. 7B is a view showing the illuminance distribution of light to be applied in the preliminary curing.

Next, another example according to this embodiment will be described. FIG. 7A shows the arrangement pattern of the droplets of the imprint material IM to be applied to the shot region SR in this example, and FIG. 7B shows the illuminance distribution of light to be applied to the shot region SR in this example. The shot region SR in this example is divided into the partial region A (first partial region) and the partial region B (second partial region) adjacent to each other. The partial region A is formed by a central portion A1 and side portions A2 and A3 which sandwich the central portion A1 in the X direction. The central portion A1 includes the contact start portion between the mold M and the imprint material IM (the portion where they first come into contact with each other) in the contact step, and is formed to have, for example, a rectangular shape. Each of the side portions A2 and A3 is continuous with the central portion A1 in the X direction, and formed to gradually expand in the Y direction toward the outside (X direction) of the shot region SR. The respective portions A1 to A3 in the partial region A have the same arrangement pattern. The partial region B is formed by partial regions B1 to B4 having arrangement patterns different from each other. The partial region B2 is a Y-axis mirror inversion of the partial region B1, the partial region B3 is an X-axis mirror inversion of the partial region B2, and the partial region B4 is an X-axis mirror inversion of the partial region B1.

In this example, the illuminance distribution of light to be applied in the preliminary curing can be set (generated) as shown in FIG. 7B. More specifically, the illuminance distribution of light is set such that, among the plurality of unit irradiation regions 50, irradiation (ON) is set for the unit irradiation regions 51 each including no boundary portion BD between the partial region A and the partial regions B (B1 to B4), and non-irradiation (OFF) is set for the unit irradiation regions 52 each including the boundary portion BD. The boundary portion BD is a portion obtained by adding a predetermined width W to the boundary between the partial region A and the partial region B (for example, with the boundary as the center). The width W can be set, for example, in a range calculated by an experiment, a simulation, or the like where voids are likely to occur. More specifically, the width W can be set (determined) in consideration that the viscoelasticity of the imprint material IM can be increased by a chain reaction of the imprint material IM or the flare of the applied light even in a region close to the region where the imprint material IM is irradiated with light in the preliminary curing. Alternatively, the width W can be determined to include the position of a defect generated due to poor filling by specifying the position after the imprint process. The width W may not be uniform but may be partially wide or narrow.

Here, if the partial regions are arranged such that the array patterns are continuous as in the partial regions B1 and B2 and/or the partial regions B3 and B4, the filling property in the boundary therebetween may be as good as inside each partial region B. For such a boundary between the partial regions B, non-irradiation (OFF) of light may be set in the preliminary curing, or irradiation (ON) may be set since the array patterns are continuous and voids are unlikely to be generated therein.

As has been described above, in this embodiment, light irradiation to the imprint material IM is controlled such that, in the shot region SR of the substrate S, the irradiation light quantity in the boundary portion BD between the first partial region and the second partial region is smaller than the irradiation light quantity in the portion different from the boundary portion BD in the preliminary curing. With this control, no preliminary curing is performed in the boundary portion BD, so that generation of voids due to an increase in viscoelasticity of the imprint material IM (that is, a decrease in filling property of the imprint material IM) can be reduced, and defects generated in the pattern of the cured product of the imprint material IM can be reduced. On the other hand, the preliminary curing is performed in the portion other than the boundary portion BD, so that the alignment accuracy between the shot region SR of the substrate S and the pattern region PR of the mold M can be improved.

Second Embodiment

The second embodiment according to the present invention will be described. This embodiment basically takes over the first embodiment, and the arrangement and processing of an imprint apparatus 100 are similar to those in the first embodiment unless otherwise specified below. In the first embodiment, the illuminance distribution is generated so as to switch irradiation (ON) and non-irradiation (OFF) of light for each unit irradiation region 50. On the other hand, if a light irradiation unit IRR (spatial light modulator 16) is configured to be capable of applying light having an intermediate illuminance (one of a plurality of illuminances other than 0) for each unit irradiation region 50, the illuminance may be individually set for each unit irradiation region 50. Even in this case, the illuminance distribution is set (generated) such that the irradiation light quantity (illuminance) in a boundary portion BD is smaller than the irradiation light quantity (illuminance) in a portion different from the boundary portion BD. Note that the intermediate illuminance is an illuminance in a range between the maximum illuminance and the minimum illuminance in each unit irradiation region, and can be arbitrary changed within the range.

For example, in the example shown in FIGS. 7A and 7B, the filling property is lower in the boundary portion between the partial region B1 and the partial region B2 and/or the boundary portion between the partial region B3 and the partial region B4 than inside each partial region B, but can be higher than in the boundary portion BD between the partial region A and the partial region B. In this case, letting the illuminance for irradiation (ON) be the maximum illuminance and the illuminance for non-irradiation (OFF) be the minimum illuminance, the illuminance in the unit irradiation region 50 including the boundary portion between the partial regions B may be set to the intermediate illuminance. In another example, among the plurality of unit irradiation regions 50, for the unit irradiation region 50 including the boundary portion BD with the width W added thereto but not including the boundary portion itself between the partial region A and the partial region B (that is, the region where the boundary itself does not pass through and only the width W passes through), the illuminance may be set to the intermediate illuminance.

Alternatively, a cumulative irradiation quantity, which is the spatial cumulative quantity of the irradiation light quantities of light beams in the preliminary curing (for example, the total value (spatial integral value) of the irradiation light quantities in the whole area of a shot region SR), may be determined in advance. Such a cumulative irradiation quantity can be determined by a plurality of factors (conditions) such as the composition of an imprint material IM, the vibration state of the imprint apparatus 100, and the area of the shot region SR. In such a case, since the cumulative irradiation quantity is made smaller than a reference cumulative quantity by partially decreasing the illuminance in the preliminary curing, the illuminance in a region where the filling property is good may be increased.

The cumulative irradiation quantity can be calculated by, for example, a product of the irradiation area, the illuminance, and the irradiation time. Depending on the imprint material IM, another component such as the reaction speed, which changes in accordance with the wavelength of light applied to the imprint material, may be further considered as the coefficient. As a method of adjusting the cumulative irradiation quantity, an example of adjustment by the illuminance and an example of adjustment by the irradiation time will be described below.

First, with reference to FIGS. 8A to 8D, the example of adjusting the cumulative irradiation quantity by adjustment of the illuminance will be described. In this case, the cumulative irradiation quantity is calculated according to following equation (1). Here, as one example, an example will be described in which the irradiation area is 70 and a plurality of unit irradiation regions are obtained by dividing the shot region SR into ten rows×seven columns. FIG. 8A is a view for explaining a case in which the illuminance given to each unit irradiation region is 1 and the irradiation time is 1. In this case, when calculated by applying to equation (1), the cumulative irradiation quantity is 70:

$$\text{cumulative irradiation quantity} = \text{irradiation area(vertical} \times \text{horizontal)} \times \text{illuminance} \times \text{irradiation time} \quad (1)$$

Here, as one example, as exemplarily shown in FIG. 8B, assume a case in which the shot region SR is divided into three partial regions formed by one partial region A and two partial regions B arrayed in the Y direction as in the example shown in FIGS. 5A to 5C. In this case, the illuminance in the unit irradiation region including the boundary portion BD between the partial region A and the partial region B is decreased to 0. Accordingly, the cumulative irradiation quantity is changed from 70 to 56 (that is, it is decreased by 14). Then, by assigning the decrease in cumulative irradiation quantity, that is, 14 evenly to all of the plurality of unit irradiation regions as exemplarily shown in FIG. 8C, the cumulative irradiation quantity can be 70. Alternatively, if it is desired to set the illuminance in the unit irradiation region including the boundary portion BD to 0, as exemplarily shown in FIG. 8D, the decrease in cumulative irradiation quantity, that is, 14 may be assigned to the unit irradiation regions each including no boundary portion BD.

Next, the example of adjusting the cumulative irradiation quantity by adjusting the irradiation time will be described. In this case, the irradiation time can be adjusted, for example, according to following equation (2). The cumulative irradiation quantity (optimal value) is a reference irradiation quantity, which is 70 in the example described above. The cumulative irradiation quantity (current value) is 56 in the example described above. The irradiation time (current value) is 1 in the example described above. According to equation (2), the irradiation time (adjusted) is 1.25.

$$\text{irradiation time(adjusted)}=(\text{cumulative irradiation quantity(optimal value)}\div\text{cumulative irradiation quantity(current value)})\times\text{irradiation time(current value)} \quad (2)$$

As has been described above, in this embodiment, the example has been described in which the light irradiation unit IRR (spatial light modulator 16) is configured to be capable of applying light having the intermediate illuminance for each unit irradiation region. As in the first embodiment, this can also improve the alignment accuracy between the shot region SR of the substrate S and the pattern region PR of the mold M while reducing generation of voids in the boundary portion BD.

<Embodiment of Method of Manufacturing Article>

A method of manufacturing an article according to the embodiment of the present invention is suitable for manufacturing an article, for example, a microdevice such as a semiconductor device or an element having a microstructure. The method of manufacturing an article according to the embodiment includes a step of forming a pattern to an imprint material supplied (applied) onto a substrate by using the above-described imprint apparatus and a step of processing the substrate on which the pattern has been formed in the preceding step. Furthermore, this manufacturing method includes other well-known steps (for example, oxidization, deposition, vapor deposition, doping, planarization, etching, resist removal, dicing, bonding, and packaging, and the like). The method of manufacturing an article according to the embodiment is superior to a conventional method in at least one of the performance, quality, productivity, and production cost of the article.

The pattern of a cured material formed using the imprint apparatus is used permanently for at least some of various kinds of articles or temporarily when manufacturing various kinds of articles. The articles are an electric circuit element, an optical element, a MEMS, a recording element, a sensor, a mold, and the like. Examples of the electric circuit element are volatile or nonvolatile semiconductor memories such as a DRAM, a SRAM, a flash memory, and a MRAM and semiconductor elements such as an LSI, a CCD, an image sensor, and an FPGA. Examples of the mold are molds for imprint.

The pattern of the cured material is directly used as the constituent member of at least some of the above-described articles or used temporarily as a resist mask. After etching or ion implantation is performed in the substrate processing step, the resist mask is removed.

Figure 9A:
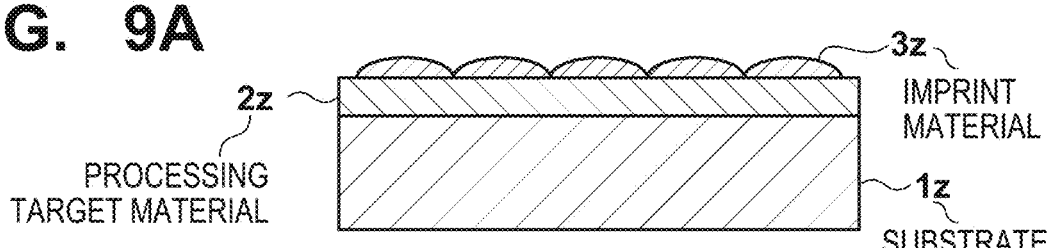
FIGS. 9A to 9F are views for explaining a method of manufacturing an article.

A detailed method of manufacturing an article will be described next. As shown in FIG. 9A, a substrate $1z$ such as a silicon wafer with a target material $2z$ to be processed such as an insulator formed on the surface is prepared. Next, an imprint material $3z$ is applied to the surface of the target material $2z$ by an inkjet method or the like. A state in which the imprint material $3z$ is applied as a plurality of droplets onto the substrate is shown here.

Figure 9B:
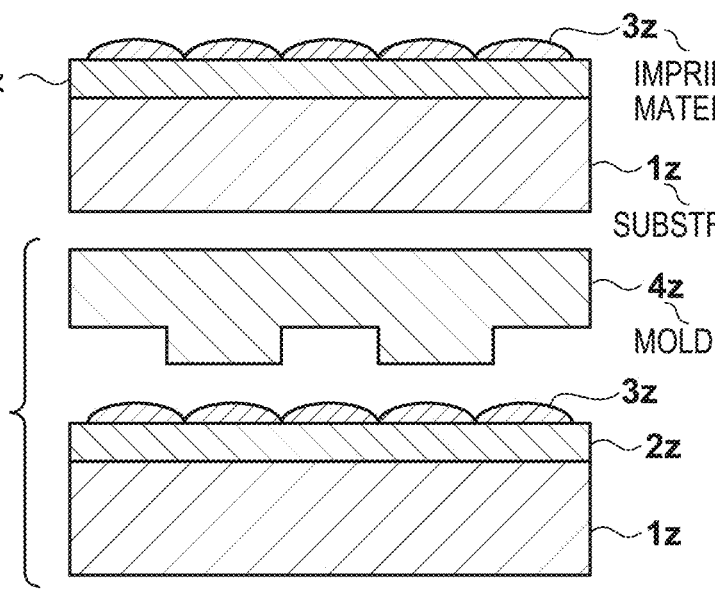
Figure 9C:
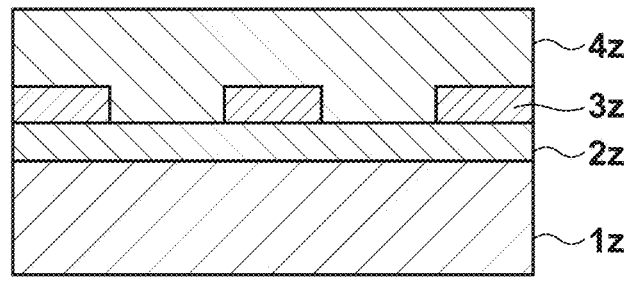

As shown in FIG. 9B, a mold $4z$ for imprint is caused to face to the substrate $1z$ such that a pattern with convex and concave portions formed in the mold $4z$ is directed to the imprint material $3z$ on the substrate $1z$. As shown in FIG. 9C, the mold $4z$ and the imprint material $3z$ applied on the substrate $1z$ are brought into contact with each other, and subjected to a pressure. The gap between the mold $4z$ and the target material $2z$ is filled with the imprint material $3z$. In this state, by irradiating the imprint material $3z$ with energy for curing through the mold $4z$, the imprint material $3z$ is cured.

Figure 9D:
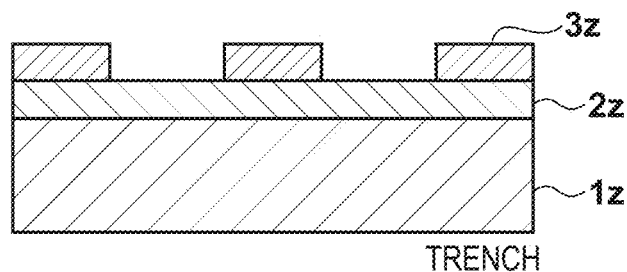

As shown in FIG. 9D, after the imprint material $3z$ is cured, the mold $4z$ is separated from the substrate $1z$. Then, the pattern of the cured material of the imprint material $3z$ is formed on the substrate $1z$. In the pattern of the cured material, the concave portion of the mold corresponds to the convex portion of the cured material, and the convex portion of the mold corresponds to the concave portion of the cured material. That is, the pattern with convex and concave portions in the mold $4z$ is transferred to the imprint material $3z$.

Figure 9E:
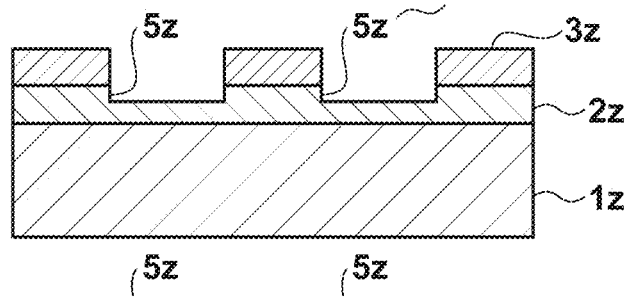
Figure 9F:
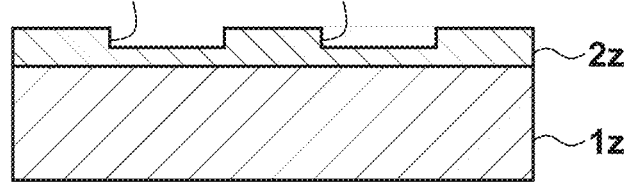

As shown in FIG. 9E, by performing etching process using the pattern of the cured material as an etching resistant mask, a portion of the surface of the target material $2z$ where the cured material does not exist or remains thin is removed to form a groove $5z$. As shown in FIG. 9F, by removing the pattern of the cured material, an article with the grooves $5z$ formed in the surface of the target material $2z$ can be obtained. Here, the pattern of the cured material is removed. However, instead of processing or removing the pattern of the cured material, it may be used as, for example, an interlayer dielectric film included in a semiconductor element or the like, that is, a constituent member of an article.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2020-092542 filed May 27, 2020, which is hereby incorporated by reference herein in its entirety.

What is claimed is:

1. An imprint method of forming a pattern of an imprint material on a shot region of a substrate using a mold, the method comprising:
    supplying the imprint material onto the shot region having a first partial region and a second partial region adjacent to the first partial region, so as to arrange droplets of the imprint material in the first partial region by a first arrangement pattern and in the second partial region by a second arrangement pattern different from the first arrangement pattern;
    performing alignment between the mold and the shot region after starting to bring the mold and the imprint material on the shot region into contact with each other;
    performing a preliminary curing of irradiating the imprint material on the shot region with light to increase a viscoelasticity of the imprint material before the alignment is completed; and
    performing a main curing of curing the imprint material on the shot region after the alignment is completed,
    wherein in the preliminary curing, the imprint material on the shot region is irradiated with light such that an irradiation light quantity in a boundary portion including a boundary between the first partial region and the second partial region is smaller than an irradiation light quantity in a portion outside the boundary portion among the shot region.

2. The method according to claim 1, wherein
    the shot region is divided into a plurality of unit irradiation regions for which the irradiation light quantity of the light can be individually adjusted, and
    in the preliminary curing, the irradiation light quantity in each unit irradiation region is adjusted such that among the plurality of unit irradiation regions, the irradiation light quantity in a first unit irradiation region in which the boundary portion is located is smaller than the irradiation light quantity in a second unit irradiation region in which the boundary portion is not located.

3. The method according to claim 1, wherein
    in the preliminary curing, the imprint material is irradiated with light such that in the shot region, the irradiation light quantity in the boundary portion is not larger than a half of the irradiation light quantity in a portion different from the boundary portion.

4. The method according to claim 1, wherein
    the boundary portion is a portion of the shot region obtained by adding a predetermined width to the boundary between the first partial region and the second partial region.

5. The method according to claim 1, wherein
    in the first partial region, arrangement of the droplets of the imprint material by the first arrangement pattern is repeated for each unit area, and in the second partial region, arrangement of the droplets of the imprint material by the second arrangement pattern is repeated for each unit area.

6. The method according to claim 1, wherein
    in the supplying, the droplets of the imprint material are arranged in a grid on the shot region, and
    the first arrangement pattern and the second arrangement pattern are different from each other in at least one of an orientation, a shape, and a dimension of the grid in which the droplets of the imprint material are arranged.

7. The method according to claim 1, further comprising contacting in which, after bringing the imprint material and the mold into contact with each other on a part of the shot region, a contact area between the mold and the imprint material is gradually enlarged,
    wherein in the first partial region, the droplets of the imprint material are arranged in a first arrangement pattern which is set such that a droplet interval in a first direction is smaller than a droplet interval in a direction perpendicular to the first direction, and
    in the second partial region, the droplets of the imprint material are arranged in a second arrangement pattern which is set such that a droplet interval in a second direction is smaller than a droplet interval in a direction perpendicular to the second direction, the second direction being different from the first direction.

8. The method according to claim 1, wherein
    each of the first partial region and the second partial region is a region in which not less than 100 droplets of the imprint material are arranged.

9. The method according to claim 1, wherein
    each of the first partial region and the second partial region has an area not less than $1/100$ of an area of the shot region.

10. The method according to claim 9, wherein
    each of the first partial region and the second partial region has an area not less than $1/10$ of the area of the shot region.

11. The method according to claim 1, wherein
    in the preliminary curing, the imprint material is cured to a first target hardness, and
    in the main curing, the imprint material is cured to a second target hardness which is higher than the first target hardness.

12. The method according to claim 1, wherein
    the alignment between the mold and the substrate are performed based on a detection result of a relative position between a mark provided in the mold and a mark provided in the substrate.

13. A method of manufacturing an article, the method comprising:
    forming a pattern on a substrate by using an imprint method according to claim 1; and
    processing the substrate, on which the pattern has been formed, to manufacture the article.

14. The method according to claim 1, further comprising:
    generating an illuminance distribution for irradiating the shot region with light in the preliminary curing, based on information indicating an arrangement of droplets to be supplied on the shot region in the supplying, such that the irradiation light quantity in the boundary portion is smaller than the irradiation light quantity in the portion outside the boundary portion,
wherein the preliminary curing is performed in accordance with the generated illuminance distribution.

15. The method according to claim 1, wherein the preliminary curing is performed such that the boundary portion is not irradiated with light and the portion outside the boundary portion among the shot region is irradiated with light.

16. An imprint apparatus that forms a pattern of an imprint material on a shot region of a substrate using a mold, the apparatus comprising: a supplier configured to supply the imprint material onto the shot region so as to arrange droplets of the imprint material in arrangement patterns different from each other between a first partial region and a second partial region adjacent to each other in the shot region; and a light irradiator configured to perform preliminary curing of irradiating the imprint material on the shot region with light to increase a viscoelasticity of the imprint material before alignment between the mold and the shot region is completed, wherein in the preliminary curing, the light irradiator is configured to irradiate the imprint material with light such that, in the shot region, an irradiation light quantity in a boundary portion between the first partial region and the second partial region is smaller than an irradiation light quantity in a portion different from the boundary portion.

* * * * *